United States Patent
Imafuku

(10) Patent No.: US 9,399,584 B2
(45) Date of Patent: Jul. 26, 2016

(54) SILICON FOCUS RING

(71) Applicant: Tokyo Electron Limited, Tokyo (JP)

(72) Inventor: Kosuke Imafuku, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/016,474

(22) Filed: Feb. 5, 2016

(65) Prior Publication Data

US 2016/0152479 A1 Jun. 2, 2016

Related U.S. Application Data

(62) Division of application No. 14/306,445, filed on Jun. 17, 2014, now Pat. No. 9,290,391, which is a division of application No. 12/888,566, filed on Sep. 23, 2010, now Pat. No. 8,785,214.

(60) Provisional application No. 61/252,205, filed on Oct. 16, 2009.

(30) Foreign Application Priority Data

Sep. 28, 2009 (JP) ................................. 2009-221793

(51) Int. Cl.
*C30B 15/00* (2006.01)
*C01B 33/02* (2006.01)

(52) U.S. Cl.
CPC ...................................... *C01B 33/02* (2013.01)

(58) Field of Classification Search
None
See application file for complete search history.

(56) References Cited

U.S. PATENT DOCUMENTS

| 8,058,186 | B2 * | 11/2011 | Moriya | C04B 41/0054 118/105 |
| 8,357,263 | B2 * | 1/2013 | Berkoh | H01J 37/32935 156/345.13 |
| 8,785,214 | B2 | 7/2014 | Imafuku | |
| 2009/0130014 | A1 | 5/2009 | Fukuyama | |

FOREIGN PATENT DOCUMENTS

| CN | 1436862 A | 8/2003 |
| JP | 08-236505 A | 9/1996 |
| JP | 2002-231699 A | 8/2002 |
| JP | 2004-079983 A | 3/2004 |
| JP | 2005-166814 A | 6/2005 |
| JP | 2007-273707 A | 10/2007 |
| JP | 2009-215135 A | 9/2009 |

\* cited by examiner

*Primary Examiner* — Seahvosh Nikmanesh
(74) *Attorney, Agent, or Firm* — Pearne & Gordon LLP

(57) ABSTRACT

A silicon focus ring in a processing chamber of a plasma etching apparatus is provided. The silicon focus ring comprises: silicon wastes an amount of which is determined based on a content of impurity in the silicon wastes and a target value of an electrical resistance of the silicon focus ring; a silicon source material an amount of which is determined based on the content of impurity in the silicon wastes and the target value of the electrical resistance of the silicon focus ring; and impurity an amount of which is determined based on the content of impurity in the silicon wastes and the target value of the electrical resistance of the silicon focus ring. The target value of the electrical resistance of the silicon focus ring is about 2Ω.

8 Claims, 2 Drawing Sheets

SILICON FOCUS RING

CROSS-REFERENCE TO RELATED APPLICATION

This is a divisional application of U.S. patent application Ser. No. 14/306,445, filed on Jun. 17, 2014, which issued Mar. 22, 2016 as U.S. Pat. No. 9,290,391, which claims the benefit of U.S. patent application Ser. No. 12/888,566, U.S. Pat. No. 8,785,214, filed on Sep. 23, 2010, Japanese Patent Application No. 2009-221793 filed on Sep. 28, 2009, and U.S. Provisional Application Ser. No. 61/252,205 filed on Oct. 16, 2009, the entire disclosures of which are incorporated herein by reference.

FIELD OF THE INVENTION

The present disclosure relates to a silicon focus ring for a plasma etching apparatus.

BACKGROUND OF THE INVENTION

Conventionally, by way of example, in the manufacturing field of a semiconductor device, there has been used a plasma etching apparatus for performing a predetermined plasma process such as an etching process onto a semiconductor wafer or a glass substrate for a liquid crystal display.

In the plasma etching apparatus, various silicon components have been used for performing a process onto a semiconductor wafer made of silicon or various silicon films. By way of example, conventionally, in the plasma etching apparatus, there has been used a silicon focus ring as a focus ring installed to surround a semiconductor wafer mounted on a mounting table. Further, as an electrode plate of a facing electrode installed to face the mounting table, there has been used a silicon electrode plate.

In the plasma etching apparatus, when a silicon component such as a silicon focus ring is exposed to the plasma, it is gradually eroded and degraded and its shape becomes changed. For this reason, reproducibility of a process becomes worse and if it is continuously used, the process quality would be deviated from an expected management value. Therefore, when the silicon component is eroded and degraded to some extent, it is regarded as an unusable component and discarded as industrial wastes. However, such a silicon component for the plasma etching apparatus is high-priced, which causes an increase in cost of consumables (COC) required for running the plasma etching apparatus.

As a countermeasure to this, there has been suggested a method in which a first ring and a second ring obtained by machining used silicon focus rings are combined and the combined silicon focus ring having a shape compatibility with a non-used silicon focus ring is recycled (see, for example, Patent Document 1). However, the method of combining rings obtained by a machining process is limited to a method of combining the machined rings having the same electric characteristic and the same shape as the non-used silicon focus ring, and, thus, a recyclable component is very restricted.

By way of example, in the manufacturing field of a solar cell, there has been suggested a recycling method that performs: a process for removing an anti-reflection film and a rear surface silver electrode film from a silicon wafer including a defective solar cell by using a hydrofluoric acid; a process for removing an aluminum electrode layer by using a hydrochloric acid; and a process for removing an impurity layer by using a mixed liquid of nitric acid and hydrofluoric acid or a sodium hydroxide in order to recover the silicon wafer including the defective solar cell to a silicon wafer capable of forming a silicon solar cell again (see, for example, Patent Document 2). However, the method of recycling the silicon wafer including the defective solar cell cannot be applied to a method of recycling various used silicon components for a plasma etching apparatus.

Patent Document 1: Japanese Patent Laid-open Publication No. 2004-79983

Patent Document 2: Japanese Patent Laid-open Publication No. 2005-166814

As described above, in a plasma etching apparatus, the silicon component for the plasma etching apparatus is a cause of an increase in cost of consumables. Further, conventionally, there has been no effective way of recycling various used silicon components for a plasma etching apparatus, which causes an increase in an amount of industrial wastes.

The present disclosure has been conceived in view of the foregoing conventional circumstances and provides a method of recycling a silicon component for a plasma etching apparatus and a silicon component for a plasma etching apparatus capable of reducing cost of consumables of the plasma etching apparatus, reducing an amount of industrial wastes, and promoting effective use of resources as compared with the conventional ones.

BRIEF SUMMARY OF THE INVENTION

In accordance with one aspect of the present disclosure, there is provided a method of recycling a silicon component in a processing chamber of a plasma etching apparatus performing an etching process on a substrate. The method includes a collecting process of collecting silicon wastes from any one of a silicon component for a plasma etching apparatus and a silicon ingot for a semiconductor wafer; a measurement process of obtaining a content of impurity based on an electric characteristic of the collected silicon wastes; an input amount determination process of determining an input amount of the silicon wastes, an input amount of a silicon source material, and an input amount of impurity based on the content of impurity obtained in the measurement process and a target value of an electric characteristic of a final product; and a silicon ingot manufacturing process of manufacturing a silicon ingot by inputting the silicon wastes, the silicon source material, and the impurity based on the input amounts determined in the input amount determination process into a crucible.

In accordance with another aspect of the present disclosure, there is provided a silicon focus ring in a processing chamber of a plasma etching apparatus. The silicon focus ring comprises: silicon wastes an amount of which is determined based on a content of impurity in the silicon wastes and a target value of an electrical resistance of the silicon focus ring; a silicon source material an amount of which is determined based on the content of impurity in the silicon wastes and the target value of the electrical resistance of the silicon focus ring; and impurity an amount of which is determined based on the content of impurity in the silicon wastes and the target value of the electrical resistance of the silicon focus ring. The target value of the electrical resistance of the silicon focus ring is about 2Ω.

In accordance with the present disclosure, it is possible to provide a method of recycling a silicon component for a plasma etching apparatus and a silicon component for a plasma etching apparatus capable of reducing cost of consumables of the plasma etching apparatus, reducing an amount of industrial wastes, and promoting effective use of resources as compared with the conventional ones.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
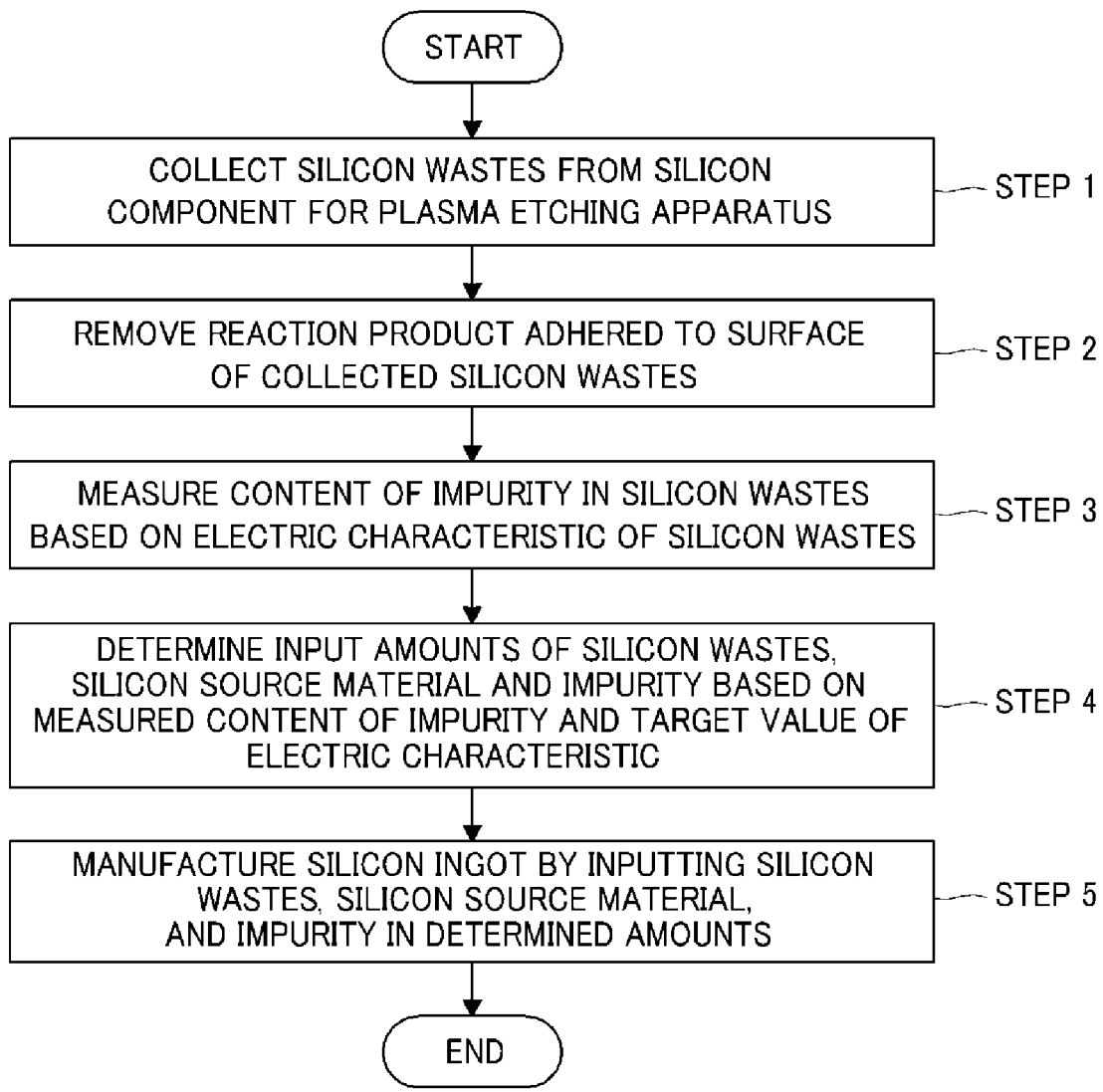
FIG. 1 is a flowchart showing a process of recycling a silicon component for a plasma etching apparatus in accordance with an embodiment of the present disclosure.

Hereinafter, embodiments of the present disclosure will be explained in detail with reference to accompanying drawings. FIG. 1 is a flowchart showing a process of recycling a silicon component for a plasma etching apparatus in accordance with the present embodiment and FIG. 2 is a longitudinal cross sectional view schematically showing a configuration example of a plasma etching apparatus.

Figure 2:
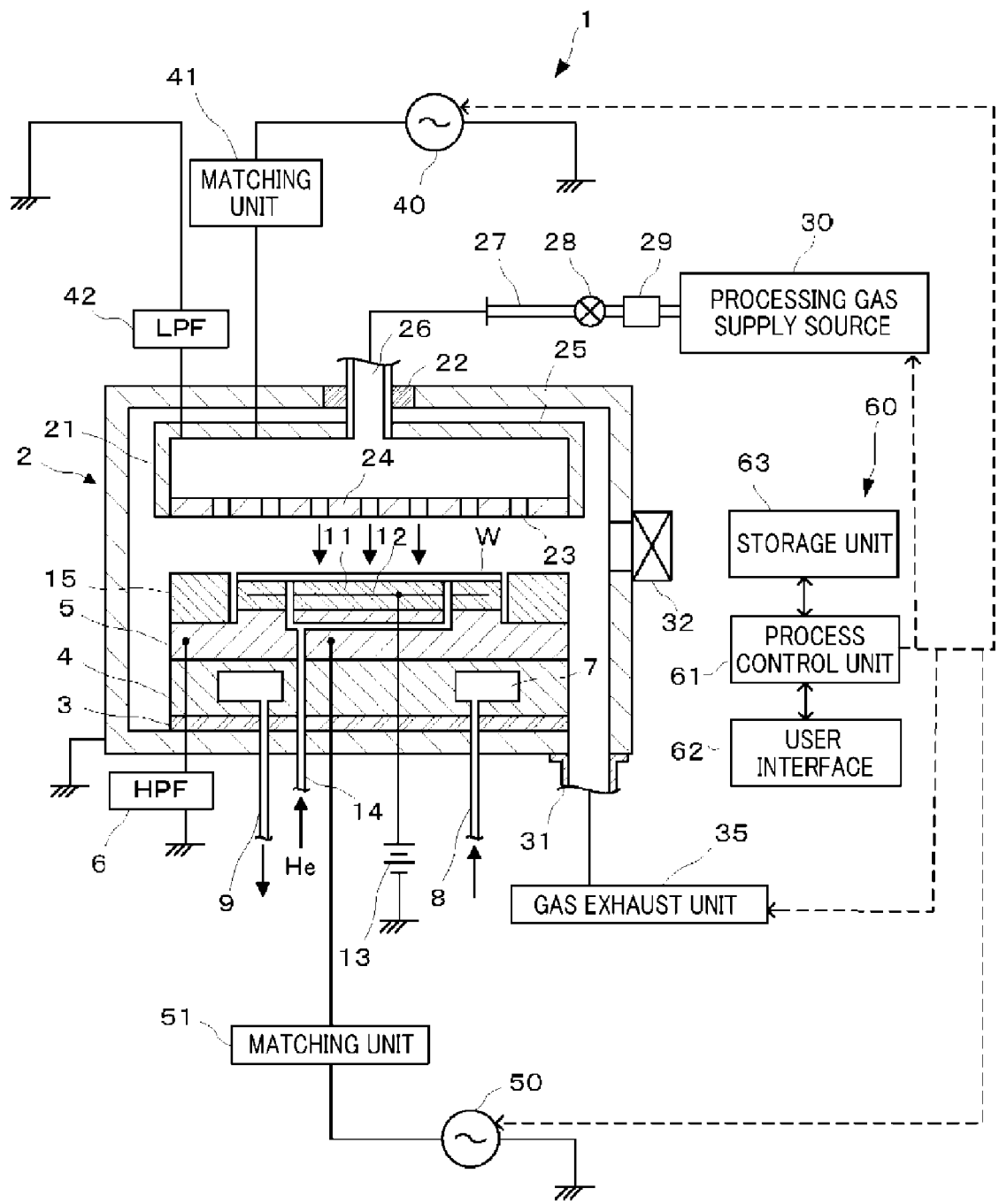
FIG. 2 is a longitudinal cross sectional view schematically showing a configuration example of a plasma etching apparatus.

Referring to FIG. 2, there will be explained a configuration of a plasma etching apparatus. A plasma etching apparatus 1 is configured as an etching apparatus of a capacitively coupled parallel plate type in which electrode plates face each other in parallel and a power supply for generating plasma is connected thereto.

The plasma etching apparatus 1 includes a cylindrical processing chamber 2 made of an aluminum whose surface is anodically oxidized, and the processing chamber 2 is grounded. Further, a substantially cylindrical susceptor support 4 for mounting thereon a target object such as a semiconductor wafer W is installed in a bottom portion of the processing chamber 2, with an insulating plate 3 made of, e.g., ceramic therebetween. Further, a susceptor (mounting table) 5 serving as a lower electrode is installed on the susceptor support 4. The susceptor 5 is connected to a high pass filter (HPF) 6.

Inside the susceptor support 4, a coolant reservoir 7 is provided. A coolant is introduced into the coolant reservoir 7 through a coolant introduction line 8 and circulated therein, and discharged through a coolant discharge line 9. A cold heat of the coolant is thermally transferred to the semiconductor wafer W via the susceptor 5 and thus the temperature of the semiconductor wafer W is controlled as desired.

An upper central portion of the susceptor 5 is formed in a protruded circular plate shape on which a circular electrostatic chuck 11 having substantially the same diameter as the semiconductor wafer W is installed. The electrostatic chuck 11 includes an electrode 12 within an insulating member. Further, a DC voltage of, e.g., about 1.5 kV is applied to the electrostatic chuck 11 from a DC power supply 13 connected to the electrode 12, so that the semiconductor wafer W is electrostatically attracted by, e.g., a Coulomb force.

A gas passage 14 for supplying a heat transfer medium (for example, a He gas) to a rear surface of the semiconductor wafer W is formed through the insulating plate 3, the susceptor support 4, the susceptor 5, and the electrostatic chuck 11. Through the heat transfer medium, a cold heat of the susceptor 5 is transferred to the semiconductor wafer W to maintain the temperature of the semiconductor wafer W at a predetermined level.

An annular focus ring 15 is installed at an upper peripheral portion of the susceptor 5 so as to surround the semiconductor wafer W mounted on the electrostatic chuck 11. The focus ring 15 is made of a conductive material and improves etching uniformity. In the plasma etching apparatus 1, the focus ring 15 is made of silicon and this silicon focus ring 15 is one of components for the plasma etching apparatus to which a recycling method of the present embodiment can be applied.

Above the susceptor 5, there is installed an upper electrode 21 facing the susceptor 5 in parallel. The upper electrode 21 is supported at an upper portion of the processing chamber 2 via an insulating member 22. The upper electrode 21 is composed of an electrode plate 24 and an electrode support 25 made of a conductive material, for supporting the electrode plate 24. The electrode plate 24 has a plurality of discharge holes 23 and faces the susceptor 5. In the plasma etching apparatus 1, the electrode plate 24 is made of silicon and this silicon electrode plate 24 is one of components for the plasma etching apparatus to which a recycling method of the present embodiment can be applied.

There is installed a gas introduction port 26 at the center of the electrode support 25 of the upper electrode 21, and the gas introduction port 26 is connected to a gas supply pipe 27. Further, the gas supply pipe 27 is connected to a processing gas supply source 30 via a valve 28 and a mass flow controller 29. The processing gas supply source 30 supplies an etching gas used for plasma etching.

There is installed an exhaust pipe 31 at a bottom portion of the processing chamber 2, and the exhaust pipe 31 is connected to a gas exhaust unit 35. The gas exhaust unit 35 includes a vacuum pump such as a turbo-molecular pump and is configured to evacuate the inside of the processing chamber 2 to be in a predetermined depressurized atmosphere, i.e., to a predetermined pressure of, e.g., about 1 Pa or less. Further, a gate valve 32 is provided at a sidewall of the processing chamber 2, and with the gate valve 32 open, the semiconductor wafer W is transferred to/from an adjacent load-lock chamber (not illustrated).

The upper electrode 21 is connected to a first high frequency power supply 40, and a matching unit 41 is provided on a power supply line thereof. Further, the upper electrode 21 is connected to a low pass filter (LPF) 42. The first high frequency power supply 40 has a frequency ranging from about 27 MHz to about 150 MHz. Accordingly, it is possible to generate high-density plasma in a desirable dissociated state within the processing chamber 2 by applying a high frequency power in such a frequency range.

The susceptor 5 serving as a lower electrode is connected to a second high frequency power supply 50, and a matching unit 51 is provided on a power supply line thereof. The second high frequency power supply 50 has a frequency in a range lower than the frequency of the first high frequency power supply 40. By applying a high frequency power in such a frequency range, it is possible to provide an appropriate ion action without damaging the semiconductor wafer W serving as a target substrate. It is desirable for the second high frequency power supply 50 to have a frequency ranging from about 1 MHz to about 20 MHz, for example.

As illustrated in FIG. 2, the whole operations of the above-described plasma etching apparatus 1 are controlled by a controller 60. The controller 60 includes a process control unit 61 having a CPU, for controlling each component of the plasma etching apparatus 1, a user interface 62, and a storage unit 63.

The user interface 62 includes a keyboard through which a process manager inputs commands to manage the plasma etching apparatus 1 and a display for visually showing an operation status of the plasma etching apparatus 1.

The storage unit 63 stores a control program (software) for executing various processes performed in the plasma etching apparatus 1 under the control of the process control unit 61; or recipes that store processing condition data. If necessary, a required process is performed in the plasma etching apparatus 1 under the control of the process control unit 61 by retrieving a necessary recipe from the storage unit 63 in response to an instruction from the user interface 62 and executing the recipe by the process control unit 61. Further, the control program or the recipe of the processing condition data which is stored in a computer-readable storage medium (for example, a hard disk, a CD, a flexible disk, a semiconductor memory or the like) may be used. The control program or the recipe can be also used on-line by receiving it from another apparatus through, for example, a dedicated line whenever necessary.

In case that the semiconductor wafer W is plasma etched by the above-described plasma etching apparatus 1, the gate valve 32 is opened, and, then, the semiconductor wafer W is loaded into the processing chamber 2 from a non-illustrated load-lock chamber and mounted on the electrostatic chuck 11. Then, a DC voltage is applied from the DC power supply 13, so that the semiconductor wafer W is electrostatically attracted onto the electrostatic chuck 11. Subsequently, the gate valve 32 is closed and the inside of the processing chamber 2 is evacuated to a predetermined vacuum level by the gas exhaust unit 35.

Thereafter, the valve 28 is opened, and a predetermined etching gas is introduced from the processing gas supply source 30 into a hollow region of the upper electrode 21 through the processing gas supply pipe 27 and the gas introduction port 26 while its flow rate is controlled by the mass flow controller 29. Then, the gas is uniformly discharged toward the semiconductor wafer W through the discharge holes 23 of the electrode plate 24 as indicated by arrows of FIG. 2.

The internal pressure of the processing chamber 2 is maintained at a predetermined level. Then, a high frequency power with a predetermined frequency is applied from the first high frequency power supply 40 to the upper electrode 21. Accordingly, a high frequency electric field is generated between the upper electrode 21 and the susceptor 5 serving as the lower electrode, and thus the etching gas is dissociated and excited into plasma.

Meanwhile, a high frequency power with a lower frequency than the above-described frequency of the first high frequency power supply 40 is applied from the second high frequency power supply 50 to the susceptor 5 serving as the lower electrode. Accordingly, ions in the plasma are attracted toward the susceptor 5 and etching anisotropy is increased by ion-assist. During this plasma etching process, silicon components for the plasma etching apparatus such as the above-described focus ring 15 and electrode plate 24 are exposed to the plasma and gradually eroded and degraded. After a predetermined time period, the used silicon components for the plasma etching apparatus are replaced with new ones and, conventionally, they have been discarded as industrial wastes.

When the plasma etching process is ended, the supplies of the high frequency power and the processing gas are stopped. In reverse order to the order described above, the semiconductor wafer W is unloaded from the processing chamber 2.

Hereinafter, there will be explained a method of recycling silicon components for the plasma etching apparatus such as the above-described focus ring 15 and electrode plate 24. In the method of recycling the silicon components for the plasma etching apparatus, the used focus ring 15 and the used electrode plate 24 can be used as silicon wastes.

By way of example, it may be possible to use silicon wastes collected during a manufacturing process of silicon components for a plasma etching apparatus. The silicon wastes may include, for example, a component with damage such as a crack or a defect during the manufacturing process, a component having an irregular size, and a component having an irregular electric characteristic such as abnormal resistance. Further, it may be possible to use silicon wastes collected from a machining process. The silicon wastes may include, for example, an inner circular residue remaining after the focus ring 15 is cut away. Moreover, it may possible to use silicon wastes such as a cone-shaped lower end and upper end of a silicon ingot, which can be obtained during a manufacturing process of the silicon ingot.

In the present embodiment, there will be explained a case of using silicon wastes originated from the used focus ring 15, the used electrode plate 24 or the like among the above-described silicon wastes. In the present embodiment, as shown in the flowchart of FIG. 1, silicon wastes are collected from a silicon component for a plasma etching apparatus such as the used focus ring 15, the used electrode plate 24 or the like (step 1).

Then, there is performed a reaction product removal process (step 2) for removing a reaction product adhered to a surface of the collected silicon wastes. In this reaction product removal process, there may be performed a method of physically removing a reaction product by injecting a cleaning material and a compressed gas to the silicon wastes. In this case, the cleaning material may be at least one of, for example, $CO_2$ particles, $Al_2O_3$ particles, $SiO_2$ particles, and nylon beads.

Further, in the reaction product removal process, it may be possible to use a method of removing a reaction product from the silicon wastes by acid etching or alkali etching instead of or in addition to the above-described removing method. In this case, the reaction product is chemically removed such that the silicon wastes reach a bulk level.

Further, if the silicon wastes are not originated from the used silicon component for the plasma etching apparatus but collected during a manufacturing process of the silicon component for the plasma etching apparatus and a reaction product is not adhered thereto, the reaction product removal process can be omitted.

Subsequently, there are performed a measurement process of measuring an electric characteristic (e.g., electrical resistance in the present embodiment) and mass of the silicon wastes from which the reaction product has been removed and a measurement process of measuring a content of impurity such as boron in the silicon wastes (step 3). The silicon components for the plasma etching apparatus may have different electric characteristics (e.g., electrical resistance) to meet a property requirement for each component. For this reason, when an ingot is manufactured, a predetermined amount of impurity such as boron is added depending on electrical resistance required for each silicon component for the plasma etching apparatus. In the measurement process, the impurity content is obtained by measuring the electrical resistance by means of a 4 probe measurement instrument and measuring the mass by means of a precise measurement instrument. In order to measure the electrical resistance, for example, a 4 probe measurement instrument produced by Napson Corporation may be employed.

Then, there is performed an input amount determination process (step 4) for determining an input amount of the silicon wastes, an input amount of a silicon source material, and an input amount of impurity based on the impurity content obtained in the measurement process and a target value of an electric characteristic (electrical resistance in the present embodiment) of a final product.

As described above, the silicon components for the plasma etching apparatus may have different electric characteristics such as electrical resistance to meet a property requirement for each component. By way of example, as for a silicon focus ring, an electrical resistance target value may be about 2Ω, and as for a silicon electrode plate, an electrical resistance target value may be about 75Ω. Based on these electrical resistance target values, the total input amount of silicon and the input amount of impurity are determined. Therefore, the input amount of the silicon wastes, the input amount of the silicon source material, and the input amount of the impurity are determined based on the mass of the silicon wastes and the impurity content. If the amount of the silicon wastes is enough to meet the required amount of silicon, the input amount of the silicon source material may be zero. Further, if the amount of impurity contained in the silicon wastes is enough to meet the required amount of impurity, the input amount of the impurity may be zero. Furthermore, as the silicon source material, it may be possible to use a polycrystalline-silicon or an impurity-containing single-crystalline-silicon obtained by adding impurity into a single-crystalline-silicon and then growing the single-crystalline-silicon.

Thereafter, there is performed a silicon ingot manufacturing process (step 5) of manufacturing a silicon ingot by inputting the silicon wastes, the silicon source material, and the impurity into a crucible based on the input amounts determined in the input amount determination process and melting them. In the silicon ingot manufacturing process, well-known methods such as a CZ method and a MCZ method may be performed. Further, by performing a machining process to form the silicon ingot manufactured in this process into a predetermined shape, a new silicon component for a plasma etching apparatus such as a silicon focus ring or a silicon electrode plate can be manufactured.

As described above, in the present embodiment, a new silicon component for a plasma etching apparatus can be manufactured by recycling a used silicon component for a plasma etching apparatus which has conventionally been discarded as industrial wastes. Therefore, it is possible to reduce cost of consumables of the plasma etching apparatus, reduce an amount of industrial wastes, and promote effective use of resources as compared with the conventional ones.

Although there has been explained the embodiment of the present disclosure, the present disclosure is not limited to the above-described embodiment and can be changed and modified in various ways. By way of example, there has been explained a case where a silicon focus ring and a silicon electrode plate are illustrated as a silicon component for a plasma etching apparatus, but the same method can be applied to other silicon components for a plasma etching apparatus. Further, in the above-described embodiment, a content of impurity is obtained by measuring electrical resistance and mass but can be obtained by measuring other electric characteristics.

What is claimed is:

1. A silicon focus ring in a processing chamber of a plasma etching apparatus, comprising:
   silicon wastes an amount of which is determined based on a content of impurity in the silicon wastes and a target value of an electrical resistance of the silicon focus ring;
   a silicon source material an amount of which is determined based on the content of impurity in the silicon wastes and the target value of the electrical resistance of the silicon focus ring; and
   impurity an amount of which is determined based on the content of impurity in the silicon wastes and the target value of the electrical resistance of the silicon focus ring,
   wherein the target value of the electrical resistance of the silicon focus ring is about 2Ω.

2. The silicon focus ring of claim 1, wherein the silicon wastes are wastes collected during a manufacturing process of silicon components.

3. The silicon focus ring of claim 1, wherein the silicon source material is a polycrystalline-silicon or an impurity-containing single-crystalline-silicon.

4. The silicon focus ring of claim 1, wherein the impurity is boron.

5. The silicon focus ring of claim 1, wherein the content of impurity is obtained by measuring one of electrical resistance and mass.

6. The silicon focus ring of claim 5, wherein measuring the electrical resistance comprises measuring the electrical resistance by a 4 probe measurement.

7. The silicon focus ring of claim 1, wherein the silicon focus ring comprises recycled silicon obtained by a silicon component recycling method.

8. The silicon focus ring of claim 7, wherein the silicon component recycling method comprises the steps of:
   a collecting process of collecting silicon wastes from any one of a silicon component for a plasma etching apparatus and a silicon ingot for a semiconductor wafer;
   a measurement process of obtaining a content of impurity based on an electric characteristic of the collected silicon wastes;
   an input amount determination process of determining an input amount of the silicon wastes, an input amount of a silicon source material, and an input amount of impurity based on the content of impurity obtained in the measurement process and a target value of an electric characteristic of a final product;
   a silicon ingot manufacturing process of manufacturing a silicon ingot by inputting the silicon wastes, the silicon source material, and the impurity based on the input amounts determined in the input amount determination process into a crucible; and
   a product manufacturing process of manufacturing the final product having the target value of the electric characteristic using the silicon ingot.

\* \* \* \* \*